(12) United States Patent
Oka

(10) Patent No.: US 11,557,528 B2
(45) Date of Patent: Jan. 17, 2023

(54) SEMICONDUCTOR DEVICE

(71) Applicant: Mitsubishi Electric Corporation, Tokyo (JP)

(72) Inventor: Hiroharu Oka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 67 days.

(21) Appl. No.: 17/128,536

(22) Filed: Dec. 21, 2020

(65) Prior Publication Data

US 2021/0233830 A1 Jul. 29, 2021

(30) Foreign Application Priority Data

Jan. 29, 2020 (JP) .............................. JP2020-012162

(51) Int. Cl.
*H01L 23/40* (2006.01)
*H01L 25/065* (2006.01)
*H01L 23/49* (2006.01)
*H01L 23/367* (2006.01)

(52) U.S. Cl.
CPC ........ *H01L 23/4006* (2013.01); *H01L 23/367* (2013.01); *H01L 23/49* (2013.01); *H01L 25/0655* (2013.01); *H01L 2023/4087* (2013.01)

(58) Field of Classification Search
CPC . H01L 23/367; H01L 23/4006; H01L 23/473; H01L 23/49; H01L 23/552; H01L 25/0655; H01L 25/072; H01L 25/18; H05K 7/1432
See application file for complete search history.

(56) References Cited

U.S. PATENT DOCUMENTS

| | | | |
|---|---|---|---|
| 2010/0025126 A1* | 2/2010 | Nakatsu | .................. B60L 50/00 361/699 |
| 2012/0275205 A1 | 11/2012 | Nakatsu et al. | |
| 2013/0128645 A1 | 5/2013 | Nakatsu et al. | |
| 2013/0277820 A1* | 10/2013 | Hotta | .................... H01L 23/473 257/712 |
| 2013/0294040 A1* | 11/2013 | Fukumasu | ........... H05K 7/1432 361/752 |

(Continued)

FOREIGN PATENT DOCUMENTS

| | | |
|---|---|---|
| CN | 103283139 A | 9/2013 |
| JP | 59155158 A | 9/1984 |

(Continued)

OTHER PUBLICATIONS

Communication dated Jan. 27, 2022 from The State Intellectual Property Office of People's Republic of China in Application No. 202110085172.3.

(Continued)

*Primary Examiner* — Fernando L Toledo
(74) *Attorney, Agent, or Firm* — Sughrue Mion, PLLC; Richard C. Turner

(57) ABSTRACT

A semiconductor device includes semiconductor modules disposed on a support member via a cooling plate; and a metal plate which supports a control board for controlling the semiconductor modules, wherein the metal plate, being supported by the support member, covers the semiconductor modules, and also fixes the control board opposite the installation surfaces of the semiconductor modules.

19 Claims, 6 Drawing Sheets

(56) References Cited

U.S. PATENT DOCUMENTS

| | | |
|---|---|---|
| 2015/0022974 A1 | 1/2015 | Nakatsu et al. |
| 2015/0289391 A1 | 10/2015 | Nakatsu et al. |
| 2017/0353118 A1 | 12/2017 | Hara et al. |
| 2018/0124935 A1 | 5/2018 | Nakatsu et al. |
| 2019/0098777 A1 | 3/2019 | Nakatsu et al. |
| 2019/0254182 A1 | 8/2019 | Nakatsu et al. |

FOREIGN PATENT DOCUMENTS

| | | |
|---|---|---|
| JP | 2003347783 A | 12/2003 |
| JP | 2010-035347 A | 2/2010 |
| JP | 2015211600 A | 11/2015 |
| WO | 2016/132851 A1 | 8/2016 |

OTHER PUBLICATIONS

Communication dated Jan. 6, 2021, from the Japanese Patent Office in application No. 2020-012162.
Office Action dated Jun. 16, 2022 in Chinese Application No. 202110085172.3.
Communication dated Sep. 13, 2022 from the Chinese Patent Office in Chinese Application No. 202110085172.3.

\* cited by examiner

SEMICONDUCTOR DEVICE

TECHNICAL FIELD

The present application relates to the field of a semiconductor device.

BACKGROUND ART

A semiconductor device having mounted thereon semiconductor modules, such as power modules, is used in an electric or a hybrid car which is driven by an electric motor. A semiconductor device mounted on a vehicle has been required to provide the space efficiency of the vehicle, and electrification has led to an increase in the number of onboard instruments and a decrease in installation space, so that it has been required to miniaturize the semiconductor device itself and to mount it directly on a motor or a transmission. The motor or the transmission generates violent vibration when driven, so that the semiconductor device is required to have a very high vibration resistance.

Semiconductor modules of this kind of semiconductor device mounted on the vehicle include connection terminals connected to wiring electrodes and connection terminals connected to a control board. Generally, signal terminals of the semiconductor modules are connected directly to the control board, establishing electrical connection therebetween by soldering or the like. In order to be connected to the semiconductor modules, the control board is disposed so as to oppose the semiconductor modules and overlaps most or all of the semiconductor modules in the direction perpendicular to the semiconductor modules.

Out of parts configuring the semiconductor device, the control board is of a configuration wherein electronic parts are mounted on a thin base material, so that the control board is low in vibration resistance, and it is required to provide thereon many fixing points for an improvement in the vibration resistance. As for the range opposite the semiconductor modules, however, it is difficult, due to limitations of the process of manufacturing the semiconductor modules, to provide the fixing points on the semiconductor modules themselves, so that the board has to be fixed by using another member.

Also, higher power of an electrified vehicle has also been required in recent years, but it is known that when the semiconductor device is made higher in power, electromagnetic noise generated by the semiconductor modules is bigger, imposing an adverse impact, such as a malfunction, on the control board.

As a measure for an improvement in the vibration resistance, for example, patent literature 1 shows a semiconductor device wherein wiring electrodes connected to semiconductor modules are sealed with a resin and wherein a support portion of a control board is provided in the resin.

Also, patent literature 2 shows a semiconductor device wherein a metal plate fixed with an exterior case is disposed in the semiconductor device and wherein a control board is fixed to the metal plate.

PRIOR ART DOCUMENT

Patent Literature

[Patent Literature 1] WO2016/132851
[Patent Literature 2] JP2010-035347A

DISCLOSURE OF INVENTION

Technical Problem

In the above described, heretofore known semiconductor devices, the object of providing the fixing points of the control board in the range opposite the semiconductor modules in order to improve the vibration resistance can be achieved, but the following problems remain unsolved. In patent literature 1, the wiring electrodes sealed with the resin are disposed close to the control board, but the resin does not have a function as an electromagnetic shield, and the wiring electrodes themselves are not ones which are connected to the ground potential, so that the wiring electrodes do not have the function as the electromagnetic shield and cannot prevent the electromagnetic noise from the semiconductor modules. Also, the wiring electrodes generate electromagnetic noise due to a fluctuation in voltage, and in addition, the wiring electrodes are disposed close to the control board, thus causing a rather greater influence of the electromagnetic noise on the control board.

In patent literature 2, the metal plate which fixes the control board is mounted to the exterior case. The exterior case is commonly mounted to a member of the ground potential, such as the frame of a vehicle, so that the metal plate serves as an electromagnetic shield, but the metal plate itself is made very large in size in order to be fixed to the exterior case, leading to an increase in the size and cost of the semiconductor device. Also, two boards, a control circuit board and a drive circuit board, are provided in a power conversion device. Although an advantageous effect as the electromagnetic shield can be obtained for the control circuit board disposed on the metal plate, there remains a problem in that the advantageous effect as the electromagnetic shield cannot be obtained for the drive circuit board disposed between the metal plate and the power modules.

The present application has been made to solve the above problems, and an object of the present application is to provide at low cost a semiconductor device which is small in size and high in vibration resistance and also in electromagnetic noise immunity.

Solution to Problem

The semiconductor device according to the present application includes semiconductor modules disposed on a support member via a cooling plate; and a metal plate which supports a control board for controlling the semiconductor modules, wherein the metal plate, being supported by the support member, covers the semiconductor modules, and also fixes the control board opposite the installation surfaces of the semiconductor modules.

Advantageous Effects of Invention

As the above-mentioned configuration has been adopted, according to the semiconductor device disclosed in the present application, the metal plate has an advantageous effect as an electromagnetic shield through the support member maintained at a ground potential. The control board can thus be protected by the metal plate from electromagnetic noise generated in the semiconductor modules. Also, a configuration is such that the metal plate is supported by the support member and that the control board is fixed above the metal plate, thus allowing for compact storage of the whole of the semiconductor device. Furthermore, the control board can be fixed in the range opposite the semiconductor modules by the metal plate, thus enabling an enhancement of vibration resistance.

As above, according to the present application, it is possible to provide at low cost a semiconductor device which is small in size and high in vibration resistance and also in electromagnetic noise immunity.

The foregoing and other object, features, aspects, and advantages of the present application will become more apparent from the following detailed description of the present application when taken in conjunction with the accompanying drawings.

DESCRIPTION OF EMBODIMENTS

First Embodiment

Figure 1:
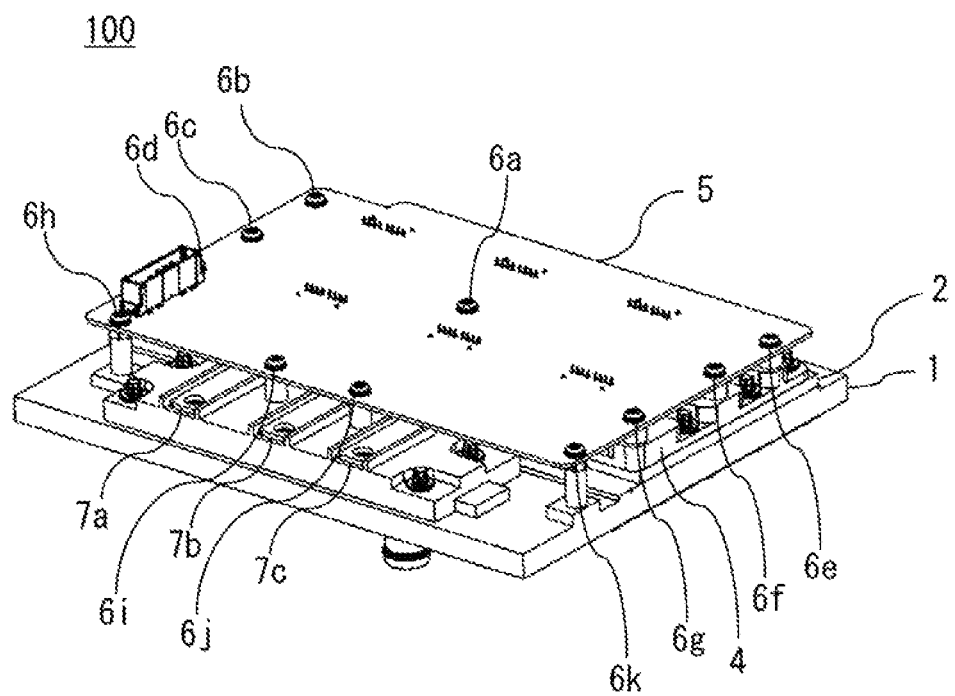
FIG. 1 is a perspective view showing an outline of a semiconductor device according to the first embodiment.
Figure 2:
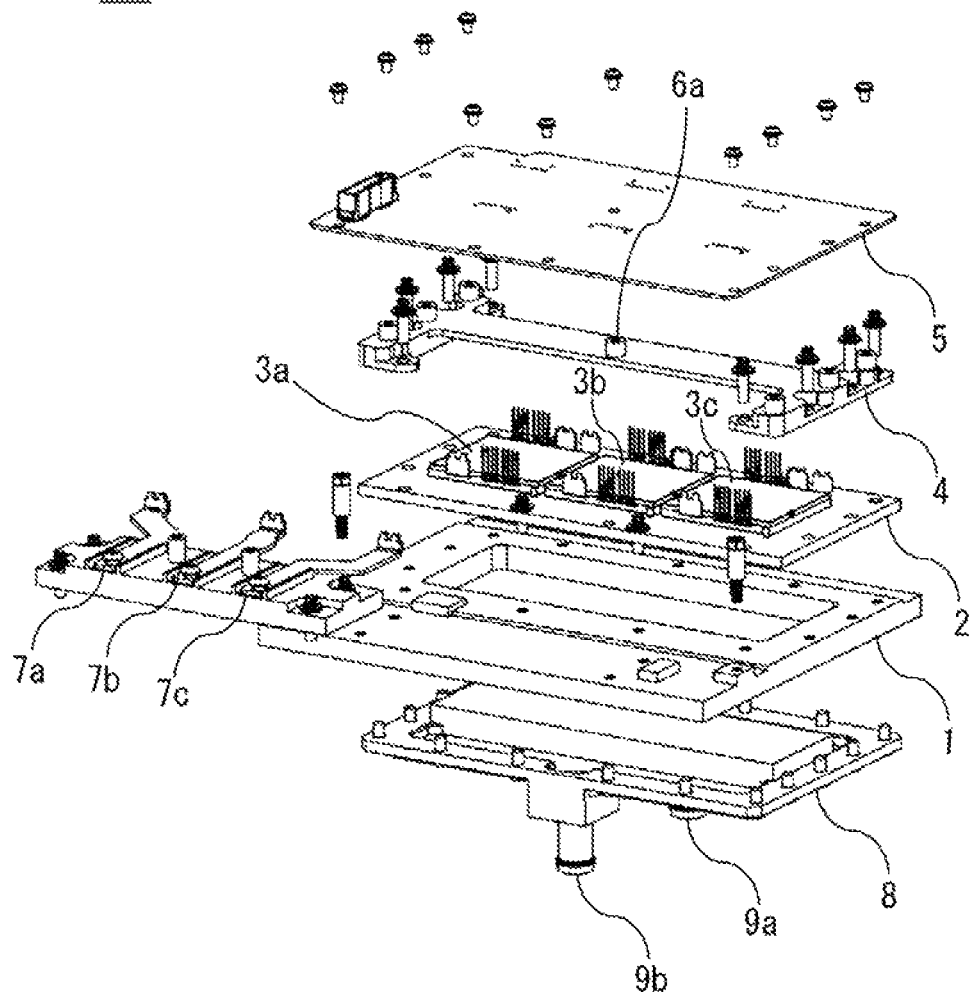
FIG. 2 is a perspective view of the whole configuration of the semiconductor device according to the first embodiment developed into individual components.

Hereinafter, a description will be given, in accordance with FIGS. 1 to 4, of a configuration according to the first embodiment of the present application. FIG. 1 shows an outline of a semiconductor device 100 according to the first embodiment. Also, FIG. 2 shows a perspective view of the whole configuration of the same device developed into individual components. In FIGS. 1 and 2, semiconductor modules 3a, 3b, 3c (hereinafter described as 3a to 3c when there are a plurality thereof) which carry out power conversion are disposed on a support member 1 via a cooling plate 2. The semiconductor modules 3a to 3c are covered with a metal plate 4, and a control board 5 for controlling the power conversion of the semiconductor modules 3a to 3c is provided above the metal plate 4. The control board 5 is fixed by control board fixing portions 6a to 6g provided on the metal plate 4. The control board fixing portion 6a is provided opposite the disposition surfaces of the semiconductor modules 3a to 3c, improving the strength of fixing the control board 5. There are also control board fixing portions 6h to 6k provided in portions other than the metal plate 4, fixing an end portion of the control board 5.

The fixing portions described in the present application are each configured of a fastening screw, a support boss, and a tap hole or a nut, and fixing portions fixed in an identical portion will be shown by the same sign.

The output terminals of the semiconductor modules 3a, 3b, 3c are connected to respective corresponding wiring electrodes 7a, 7b, 7c. The semiconductor device 100 is connected to a high voltage battery, although not shown in the drawings of the present application, and power from the battery is supplied to the semiconductor modules 3a to 3c via a similarly not shown smoothing capacitor and then supplied to a three-phase AC motor via the wiring electrodes 7a to 7c.

A lower plate 8, being provided on the support member 1, is configured so that cooling water is drawn in through a feed pipe 9a in the lower plate 8 and caused to flow to a drainpipe 9b. The cooling water cools cooling fins of the cooling plate 2 from opposite the disposition surfaces of the semiconductor modules 3a to 3c, absorbing the heat generated in the semiconductor modules 3a to 3c.

Figure 3:
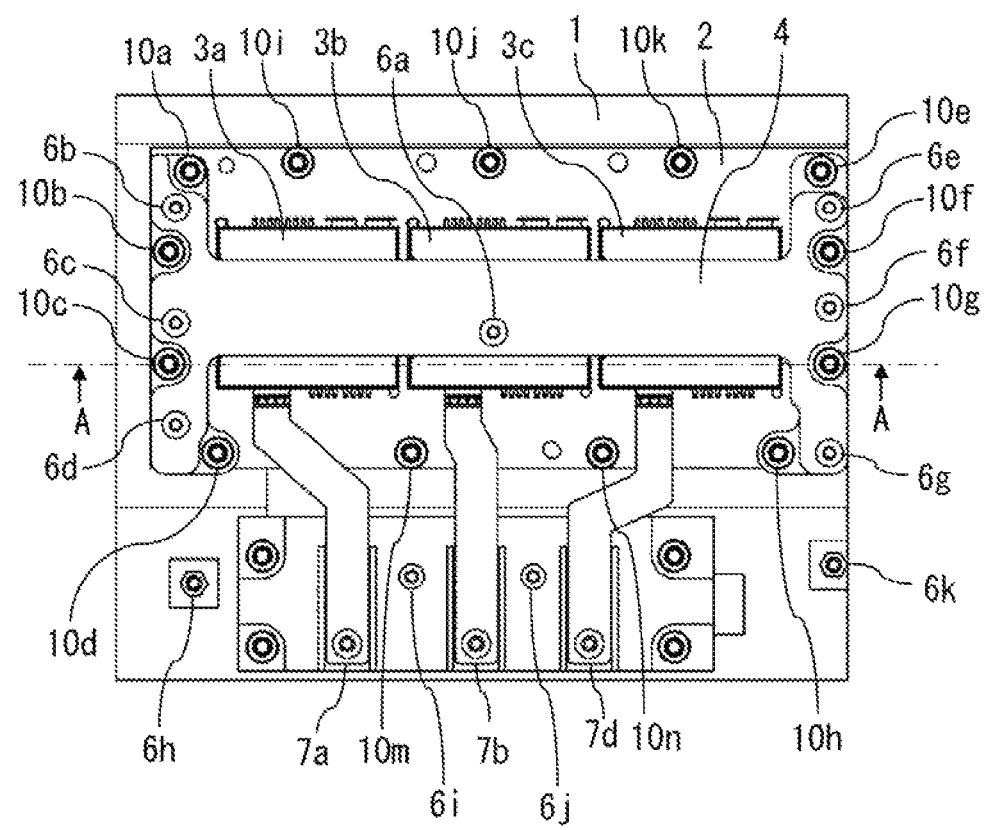
FIG. 3 is a plan view with a control board removed from the semiconductor device according to the first embodiment.
Figure 4:
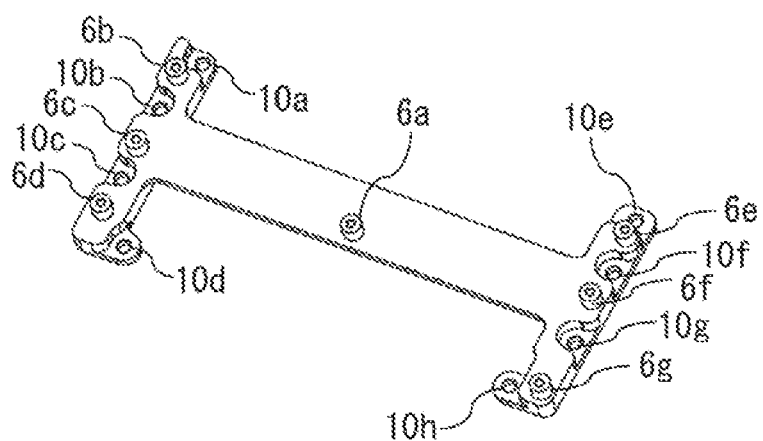
FIG. 4 is a perspective view showing the shape of a metal plate of the semiconductor device according to the first embodiment.

FIG. 3 is a plan view showing the state in which the control board 5 is removed from the semiconductor device 100, wherein the metal plate 4, the shape of which is shown in FIG. 4, is mounted on the support member 1 across the cooling plate 2 and semiconductor modules 3a to 3c. In FIGS. 2 and 3, the metal plate 4 is disposed between the control board 5 and the cooling plate 2, and furthermore, overlaps and covers most of the semiconductor modules 3a to 3c in the direction perpendicular to the semiconductor modules 3a to 3c. The metal plate 4 is screw fixed, by being jointly fastened, to the cooling plate 2 and the support member 1 in cooling plate fixing portions 10a to 10h. Apart from the jointly fastening fixation of the metal plate 4, cooling plate fixing portions 10m and 10n, 10i to 10k are provided, fixing the cooling plate 2 to the support member 1.

As shown in FIG. 4, the metal plate 4 has a bridge portion covering the semiconductor modules 3a to 3c, a plurality of protruding portions provided at each end of the bridge portion, the cooling plate fixing portions 10a to 10h with which to jointly fasten the protruding portions and the cooling plate 2, and the control board fixing portions 6a to 6g with which to fix the control board 5. The metal plate 4, being made of a metallic material such as aluminum, copper, or iron, is manufactured by being processed into a predetermined shape by die casting or the like.

In the first embodiment, a description is given using the structure of the die-cast metal plate 4, but a metallic plate can also be processed into the metal plate 4, and the control board fixing portions 6a to 6g may be formed by burring. Also, the control board fixing portions 6a to 6g may be configured by nuts firmly fixed to the metal plate 4.

Figure 5:
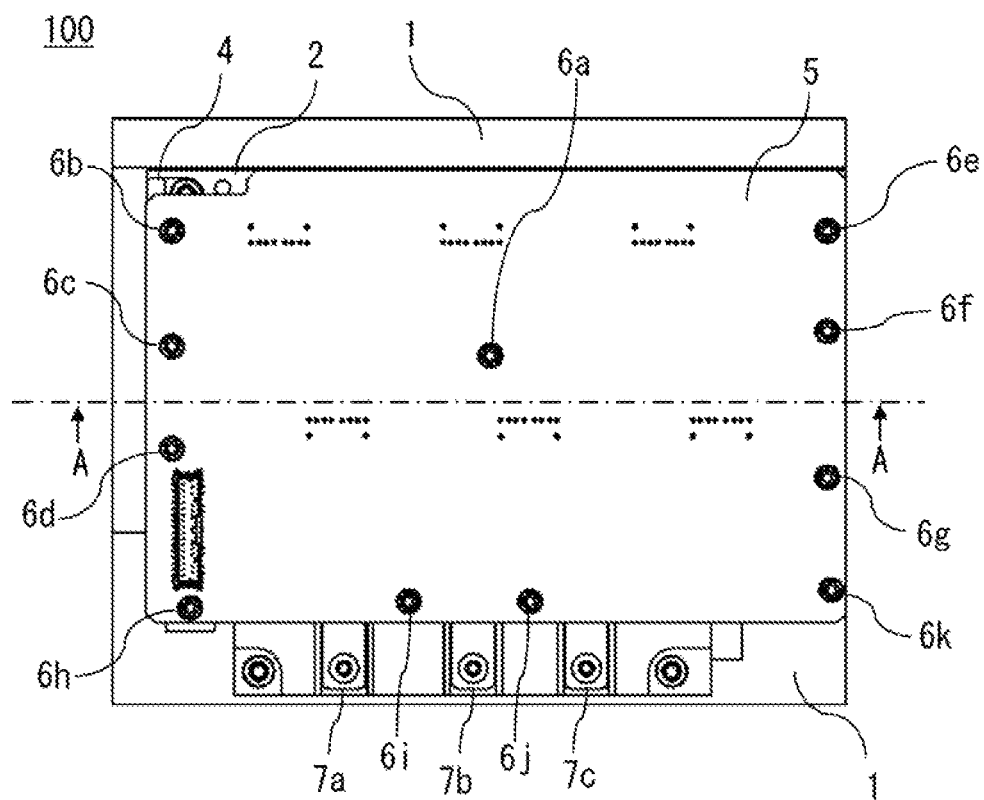
FIG. 5 is a plan view showing the whole of the semiconductor device according to the first embodiment.
Figure 6:
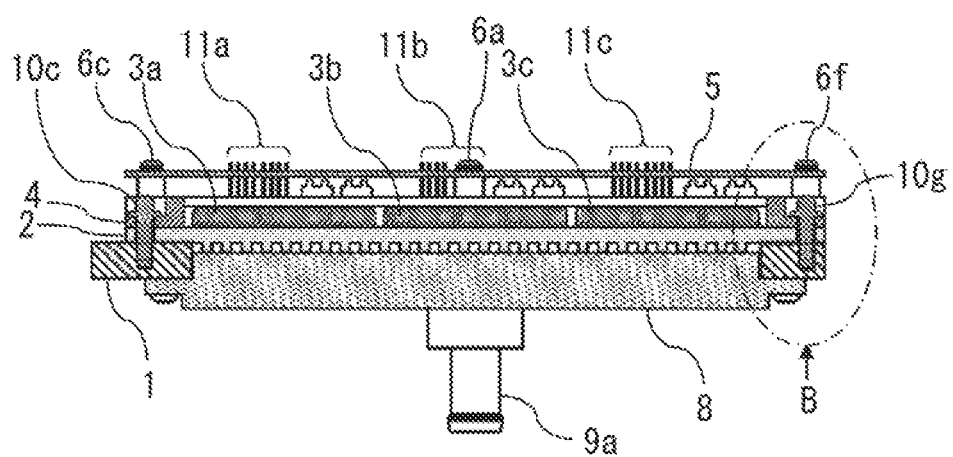
FIG. 6 is a sectional view of the semiconductor device according to the first embodiment.

Next, a detailed description will be given, referring to FIGS. 5 to 8, of the first embodiment. FIG. 5 shows a plan view of the semiconductor device 100. FIG. 6 shows a section AA of FIG. 5. As the section, being covered with the control board 5, is difficult to see in FIG. 5, a section on FIG. 3 is shown as the section AA for reference. In the sectional view of FIG. 6, the semiconductor device 100 is of a stacked structure in the order of the support member 1, the cooling plate 2, the semiconductor modules 3a to 3c, the metal plate 4, and the control board 5. The cooling plate fixing portions 10c, 10g are provided for fixing them, and the cooling plate 2 and the metal plate 4 are fixed, by being jointly fastened, to the support member 1 with the fastening screws. Also, the control board fixing portions 6a, 6c, 6f are provided on the metal plate 4, fixing the control board 5 opposite the installation surfaces of the semiconductor modules 3a to 3c.

Also, signal terminal pins 11a to 11c extend from the semiconductor modules 3a to 3c and are connected to the control board 5. In order to avoid the high voltage portions and the signal terminal pins 11a to 11c of the semiconductor modules 3a to 3c, the metal plate 4 has a shape such that the bridge portion is reduced in width above the installation surfaces of the semiconductor modules 3a to 3c. For this reason, in FIG. 6, only the protruding portions one at each end of the metal plate 4 can be seen as in section, and the bridge portion of the metal plate 4 is in the state in which the side surface thereof is open to view.

Although not shown, an insulating member, such as an insulating sheet, may be provided in portions opposed to the high voltage portions and the signal terminal pins 11a to 11c of the semiconductor modules 3a to 3c.

Also, without going into detail, the lower plate 8 is below the cooling plate 2, and the radiating fins of the cooling plate 2 are cooled by cooling water coming in through the feed pipe 9a. The present drawing shows an example in which a cooling water flow path is configured by the support member 1, the cooling plate 2, and the lower plate 8, but the support member 1 and the lower plate 8 may be integrated.

Figure 7:
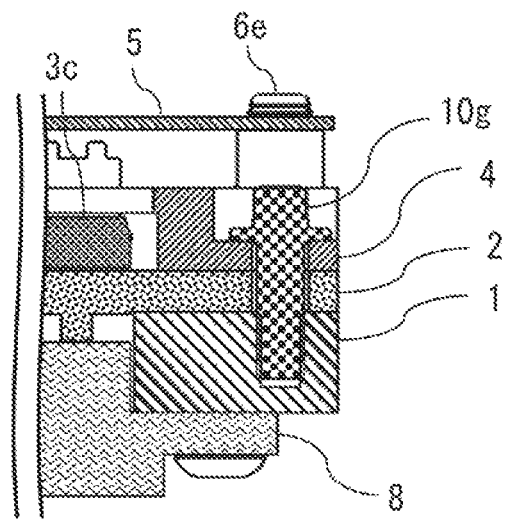
FIG. 7 is a partial enlarged view of the sectional view of the semiconductor device according to the first embodiment

FIG. 7 shows an enlarged sectional view of a jointly fastening and fixing portion B of the metal plate 4 and the cooling plate 2. As shown in FIG. 7, the support member 1, the cooling plate 2, and the metal plate 4 are fixed, by being jointly fastened, with the fastening screw of the cooling plate fixing portion 10g. The support member 1 is mounted on the frame and transmission or motor of a vehicle directly or via a still another member, but these parts are at the ground potential of the vehicle, so that the metal plate 4 jointly fastened to the support member 1 is also maintained at the ground potential. For this reason, the metal plate 4 has an advantageous effect as an electromagnetic shield against electromagnetic noise generated by the semiconductor modules 3a to 3c.

In FIG. 7, the head bearing surface of the fastening screw of the cooling plate fixing portion 10g is provided in a position one step lower than the upper surface of the metal plate 4 and close to the cooling plate 2. By adopting this kind of structure, the fastening screw can be reduced in length, preventing the screw from loosening or breaking due to an occurrence of expansion or contraction of the screw depending on ambient temperatures.

Also, as seen from FIGS. 3 and 6, the metal plate 4 and the cooling plate 2 are jointly fastened and fixed to the support member 1, so that the area of the fixing portions can be reduced compared with when the plates are fixed separately, and also it is possible to miniaturize the metal plate 4 itself as shown in FIG. 4. The control board fixing portions 6a to 6g are provided on the metal plate 4 and are used to fix the control board 5. The metal plate 4 allows the control board fixing portion 6a to be added in the range opposite the semiconductor modules 3a to 3c, so that it is possible to increase the number of fixing points of the control board 5, and thus possible to enhance the vibration resistance of the control board 5. Furthermore, according to this configuration, the metal plate 4 and the cooling plate 2 which hold the control board 5 are jointly fastened by the fastening screws, so that it is possible to obtain the advantageous effect of cooling the board via the fastening screws.

The case is shown in which the one control board fixing portion 6a is provided in the range opposite the semiconductor modules 3a to 3c, but a plurality of control board fixing portions can be provided on the metal plate 4. In this case, it is possible to further enhance the vibration resistance of the control board 5.

Also, it is also possible to promote cooling of the semiconductor modules 3a to 3c by bringing them into contact with the metal plate 4. At this time, the metal plate 4 and the semiconductor modules 3a to 3c may be brought into direct contact and may also be brought into contact via a thermally conductive medium, such as a thermally conductive grease or a thermally conductive sheet. Furthermore, it is possible to fix the semiconductor modules 3a to 3c by having a structure in which the semiconductor modules 3a to 3c are pressed against the cooling plate 2 by the rigidity of the metal plate 4. In this case, the fixing members with which to fix the semiconductor modules 3a to 3c to the cooling plate 2 are no more needed, enabling a reduction in cost.

In the present embodiment, all the fixing points of the metal plate 4 and the support member 1 are used to jointly fasten them with the cooling plate 2, but it is possible to obtain the same advantageous effect even when only some of the fixing points are used for the joint fastening. Furthermore, the individual drawings show the semiconductor device 100 having mounted thereon the three semiconductor modules, but the advantageous effects in the present application can be obtained regardless of the number of semiconductor modules and the mode of layout thereof (such as in series, in parallel, or in zigzag).

As above, according to the first embodiment, the metal plate 4 jointly fastened, together with the cooling plate 2, to the support member 1 maintained at the ground potential covers the semiconductor modules 3a to 3c in the direction perpendicular to the semiconductor modules 3a to 3c, so that the metal plate 4 can have a function as an electromagnetic shield against the control board 5. Furthermore, it is possible to have the fixing points of the control board 5 in the range opposite the semiconductor modules 3a to 3c, enabling an enhancement of the vibration resistance. Also, the metal plate 4 and the cooling plate 2 are jointly fastened and fixed, and thereby it is possible to keep the metal plate 4 to a minimum necessary size which covers the semiconductor modules 3a to 3c, and also possible to miniaturize and simplify the fixing portions compared with when the metal plate 4 and the cooling plate 2 are fixed separately. It is possible, owing to the present embodiment, to achieve a miniaturization of the device, and furthermore, to achieve a reduction in cost resulting from miniaturization of the parts and simplification of the fixing portions.

Figure 8:
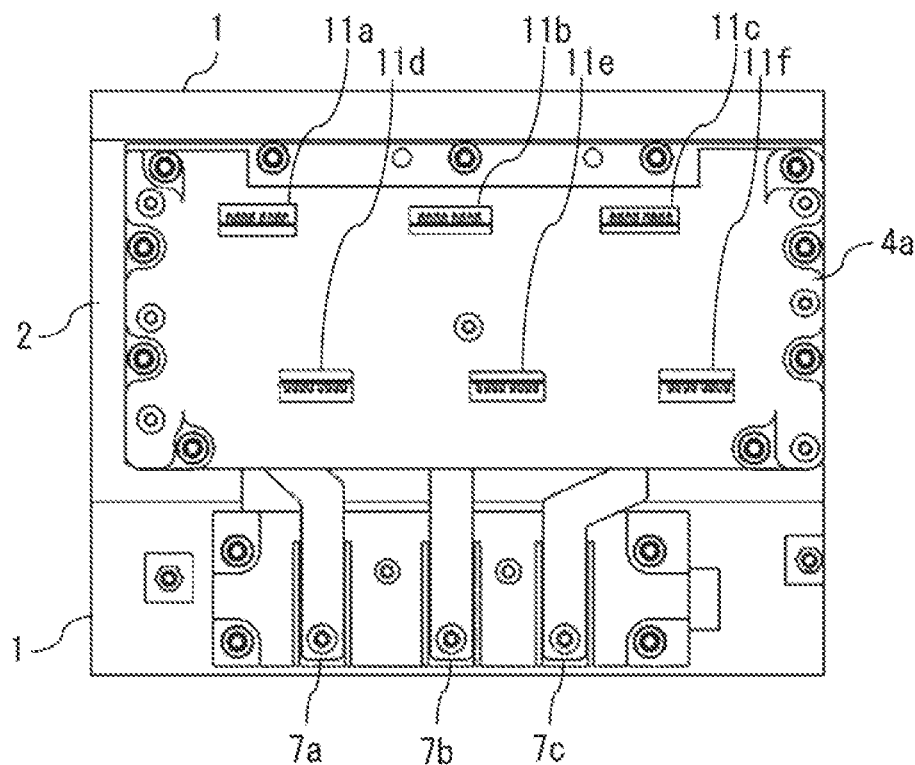
FIG. 8 is a plan view showing a modification example of the shape of the metal plate of the semiconductor device according to the first embodiment.

The metal plate 4 shown in FIG. 4 has an H shape in order to avoid the high voltage portions of the semiconductor modules 3a to 3c, but as shown in FIG. 8, may be formed into a plate form such as to cover all the semiconductor modules 3a to 3c with a metal plate 4a. In this case, the metal plate 4a has through holes, meaning that signal terminal pins 11a to 11f of the semiconductor modules 3a to 3c are connected to the control board 5 through the through holes.

By adopting this kind of configuration, it is possible to more enhance the effect of electromagnetic shield against the electromagnetic noise generated in the semiconductor modules 3a to 3c.

Second Embodiment

Figure 9:
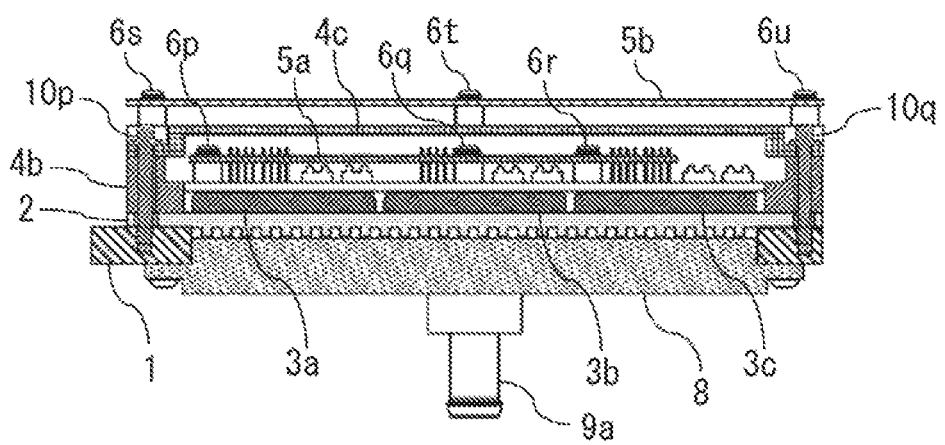
FIG. 9 is a sectional view of a semiconductor device according to the second embodiment.

Hereinafter, a description will be given, based on FIG. 9, of the second embodiment of the present application. FIG. 9 is a sectional view of a main portion similar to that of FIG. 6. As shown in FIG. 9, a semiconductor device according to the present embodiment is configured of the support member 1, the cooling plate 2, the semiconductor modules 3a to 3c which, being mounted on the cooling plate 2, carry out power conversion, a first metal plate 4b disposed on the cooling plate 2, a first control board 5a mounted above the first metal plate 4b, a second metal plate 4c mounted on the first metal plate 4b, a second control board 5b disposed above the second metal plate 4c, and the lower plate 8 configuring a cooling flow path. Although not shown in the present drawing, the first and second control boards 5a and 5b are commonly connected together using an FPC, a harness, a board-to-board connector, or the like.

The signal terminal pins 11a to 11f of the semiconductor modules 3a to 3c are connected to the first control board 5a, providing drive circuits for the semiconductor modules 3a to 3c, and logic circuits, such as a computer and a memory, which control the semiconductor modules 3a to 3c are assembled to the second control board 5b. The control boards are thus provided in layers, and thereby the second control board 5b susceptible to the influence of the electromagnetic noise can be kept away from the semiconductor modules 3a to 3c which are an electromagnetic noise source.

The first metal plate 4b overlaps and covers most of the semiconductor modules 3a to 3c in the direction perpendicular to the semiconductor modules 3a to 3c, and also fixes the first control board 5a opposite the installation surfaces of the semiconductor modules 3a to 3c. Also, the second metal plate 4c covers the parts mounting surface of the first control board 5a in the direction perpendicular to the semiconductor modules 3a to 3c, and also fixes the second control board 5b opposite the parts mounting surface of the first control board 5a. The first and second metal plates 4b and 4c, together with the cooling plate 2, are jointly fastened to the support member 1. The first and second metal plates 4b and 4c are both made of a metal, and a material such as aluminum, copper, or iron is used as the metal.

The support member 1 is connected to the ground potential of the vehicle. For this reason, the first and second metal plates 4b and 4c have the advantageous effect as the electromagnetic shield against the electromagnetic noise generated by the semiconductor modules 3a to 3c. The first and second metal plates 4b and 4c and the cooling plate 2 are jointly fastened and fixed to the support member 1, so that it is possible to simplify the fixing portions compared with when the plates are fixed separately, and also possible to miniaturize the first and second metal plates 4b and 4c themselves. Control board fixing portions 6p to 6u are provided on the first and second metal plates 4b and 4c, and are used to fix the control boards 5a, 5b. The control board fixing portions 6p to 6r, 6t are added in the range opposite the semiconductor modules 3a to 3c and the control board 5a, so that it is possible to increase the number of fixing points of the first and second control boards 5a and 5b, and possible to enhance the vibration resistance of the control boards. The present drawing shows an example in which the cooling water flow path is configured by the support member 1, the cooling plate 2, and the lower plate 8, but the support member 1 and the lower plate 8 may be integrated.

As above, according to the second embodiment, even in the case of the two control boards 5a, 5b, it is possible, in the same way as in the first embodiment, to provide at low cost a semiconductor device which is small in size and high in vibration resistance and also in electromagnetic noise immunity. Also, the first control board 5a is used for a drive circuit, while the second control board 5b is used for a logic circuit, and thereby it is possible to more enhance the electromagnetic noise immunity of the semiconductor device 100.

In the embodiments of the present application, a description has been given of a semiconductor device which is used in an electric or a hybrid vehicle driven by an electric motor, but the semiconductor device, as long as it is utilized as a semiconductor device small in size, low in cost, and high in vibration resistance, can be used for another purpose.

Although the present application is described above in terms of various exemplary embodiments and implementations, it should be understood that the various features, aspects, and functionality described in one or more of the individual embodiments are not limited in their applicability to the particular embodiment with which they are described, but instead can be applied, alone or in various combinations, to one or more of the embodiments.

It is therefore understood that numerous modifications which have not been exemplified can be devised without departing from the scope of the present application. For example, at least one of the constituent components may be modified, added, or eliminated. At least one of the constituent components mentioned in at least one of the preferred embodiments may be selected and combined with the constituent components mentioned in another preferred embodiment.

The invention claimed is:

1. A semiconductor device, comprising:
   semiconductor modules disposed on a support member via a cooling plate; and
   a metal plate which supports a control board for controlling the semiconductor modules, wherein
   the metal plate, being supported by the support member, covers the semiconductor modules, and also fixes the control board opposite the installation surfaces of the semiconductor modules, and
   wherein the metal plate is in contact with the semiconductor modules.

2. The semiconductor device according to claim 1, wherein
   the metal plate, together with the cooling plate, is jointly fastened to the support member maintained at a ground potential.

3. The semiconductor device according to claim 2, wherein
   the cooling plate and the metal plate are jointly fastened to the support member with screws, and head bearing surfaces of the screws are provided in positions one step lower than an upper surface of the metal plate and close to the cooling plate.

4. The semiconductor device according to claim 2, wherein
   the metal plate has a rigidity and has a structure in which to press the semiconductor modules against the cooling plate.

5. The semiconductor device according to claim 1, wherein
   the metal plate has a rigidity and has a structure in which to press the semiconductor modules against the cooling plate.

6. The semiconductor device according to claim 1, wherein
   the metal plate has through holes, and signal terminal pins of the semiconductor modules are connected to the control board through the through holes.

7. The semiconductor device according to claim 4, wherein
   the metal plate has through holes, and signal terminal pins of the semiconductor modules are connected to the control board through the through holes.

8. The semiconductor device according to claim 2, wherein
the metal plate has thereon fixing portions which fix the control board, and the fixing portions are formed by burring.

9. The semiconductor device according to claim 2, wherein
the metal plate has thereon fixing portions which fix the control board, and the fixing portions are configured of nuts secured to the metal plate.

10. The semiconductor device according to claim 2, wherein
the metal plate has provided thereon an insulating member opposite high voltage portions of the semiconductor modules.

11. The semiconductor device according to claim 1, wherein
the metal plate has provided thereon an insulating member opposite high voltage portions of the semiconductor modules.

12. The semiconductor device according to claim 4, wherein
the metal plate has provided thereon an insulating member opposite high voltage portions of the semiconductor modules.

13. A semiconductor device, comprising:
semiconductor modules disposed on a support member via a cooling plate; and
a metal plate which supports a control board for controlling the semiconductor modules, wherein
the metal plate, being supported by the support member, covers the semiconductor modules, and also fixes the control board opposite the installation surfaces of the semiconductor modules,
wherein the metal plate, together with the cooling plate, is jointly fastened to the support member maintained at a ground potential, and
wherein the metal plate has through holes, and signal terminal pins of the semiconductor modules are connected to the control board through the through holes.

14. The semiconductor device according to claim 2, wherein
the metal plate has provided thereon a bridge portion which covers the semiconductor modules and a plurality of protruding portions at each end of the bridge portion.

15. The semiconductor device according to claim 3, wherein
the metal plate has provided thereon a bridge portion which covers the semiconductor modules and a plurality of protruding portions at each end of the bridge portion.

16. The semiconductor device according to claim 4, wherein
the metal plate has provided thereon a bridge portion which covers the semiconductor modules and a plurality of protruding portions at each end of the bridge portion.

17. The semiconductor device according to claim 13, wherein
the metal plate has provided thereon an insulating member opposite high voltage portions of the semiconductor modules.

18. A semiconductor device, comprising:
semiconductor modules disposed on a support member via a cooling plate;
a first metal plate which supports a first control board for controlling the semiconductor modules; and
a second metal plate which supports a second control board, wherein
the first metal plate, being supported by the support member, covers the semiconductor modules, and also fixes the first control board opposite the installation surfaces of the semiconductor modules, and
the second metal plate covers the parts mounting surface of the first control board, and also fixes the second control board opposite the parts mounting surface of the first control board.

19. The semiconductor device according to claim 18, wherein
the second metal plate, together with the cooling plate and the first metal plate, is jointly fastened to the support member maintained at a ground potential.

* * * * *